(12) United States Patent
Yin et al.

(10) Patent No.: US 12,216,003 B2
(45) Date of Patent: Feb. 4, 2025

(54) PHOTOCURRENT AMPLIFICATION CIRCUIT, AMPLIFICATION CONTROL METHOD, OPTICAL DETECTION MODULE AND DISPLAY APPARATUS

(71) Applicant: BOE TECHNOLOGY GROUP CO., LTD., Beijing (CN)

(72) Inventors: Xinshe Yin, Beijing (CN); Hui Zhao, Beijing (CN); Xinbin Han, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 18/032,923

(22) PCT Filed: Jan. 25, 2022

(86) PCT No.: PCT/CN2022/073824
§ 371 (c)(1),
(2) Date: Apr. 20, 2023

(87) PCT Pub. No.: WO2023/141765
PCT Pub. Date: Aug. 3, 2023

(65) Prior Publication Data
US 2024/0377250 A1    Nov. 14, 2024

(51) Int. Cl.
*G01J 1/44*    (2006.01)
*H03H 7/06*    (2006.01)
(52) U.S. Cl.
CPC .......... *G01J 1/44* (2013.01); *G01J 2001/446* (2013.01); *H03H 7/06* (2013.01)

(58) Field of Classification Search
CPC ......... G01J 1/44; G01J 2001/446; H03H 7/06
USPC ...................................... 250/214 R
See application file for complete search history.

(56) References Cited

U.S. PATENT DOCUMENTS

| 2009/0058502 | A1 | 3/2009 | Morosawa |
| 2014/0291488 | A1 | 10/2014 | Laforce |
| 2017/0039944 | A1* | 2/2017 | Ma ........................ G09G 3/3258 |
| 2017/0270338 | A1* | 9/2017 | Ding .................. G06V 40/1318 |
| 2017/0296074 | A1 | 10/2017 | Zhang et al. |

(Continued)

FOREIGN PATENT DOCUMENTS

| CN | 101377438 A | 3/2009 |
| CN | 103384313 A | 11/2013 |

(Continued)

*Primary Examiner* — Thanh Luu
*Assistant Examiner* — Mai Thi Ngoc Tran
(74) *Attorney, Agent, or Firm* — WHDA, LLP

(57) ABSTRACT

A photocurrent amplification circuit, an amplification control method, an optical detection module and a display apparatus are provided, where the photocurrent amplification circuit includes a photoelectric sensor, a compensation circuit, a reset circuit, an energy storage circuit and a drive circuit, and the photoelectric sensor is configured to sense the optical signal and convert the optical signal into the photocurrent signal; the compensation circuit controls the communication between the control terminal of the drive circuit and the first terminal of the drive circuit under the control of the compensation control signal; the reset circuit controls the communication between the first voltage terminal and the control terminal of the drive circuit under the control of the reset control signal.

15 Claims, 4 Drawing Sheets

(56) References Cited

U.S. PATENT DOCUMENTS

2019/0156747 A1    5/2019   Nie et al.
2021/0210964 A1    7/2021   Cao et al.

FOREIGN PATENT DOCUMENTS

| CN | 105046247 A | 11/2015 |
| CN | 105962922 A | 9/2016 |
| CN | 106328061 A | 1/2017 |
| CN | 109767714 A | 5/2019 |
| CN | 112509515 A | 3/2021 |
| CN | 113011292 A | 6/2021 |

\* cited by examiner

PHOTOCURRENT AMPLIFICATION CIRCUIT, AMPLIFICATION CONTROL METHOD, OPTICAL DETECTION MODULE AND DISPLAY APPARATUS

CROSS-REFERENCE TO RELATED APPLICATION

This application is the U.S. national phase of PCT Application PCT/CN2022/073824 filed on Jan. 25, 2022.

TECHNICAL FIELD

The present disclosure relates to the technical field of optical detection, and in particular to a photocurrent amplification circuit, an amplification control method, an optical detection module and a display apparatus.

BACKGROUND

With the widespread application of AI (Artificial Intelligence, artificial intelligence) technology in mobile display products, the application of client in a specific environment is customized according to the user's application environment to increase the user's experience feeling in different environments, so it is necessary to monitor the user's environment during usage at any time. In the existing ambient light detection module, the characteristics of TFT (thin-film transistor) can be used to make an ambient light sensor on the display screen, the light leakage current signal generated by the photoelectric sensor made of thin film sensing the optical signal is pA level, it is relatively difficult to sample and detect the light leakage current signal for an external sampling circuit, and it is necessary to amplify the pA level of current to nA or uA level.

SUMMARY

In one aspect, an embodiment of the present disclosure provides a photocurrent amplification circuit, which includes a photoelectric sensor, a compensation circuit, a reset circuit, an energy storage circuit, and a drive circuit,
where the photoelectric sensor is configured to sense an optical signal, convert the optical signal into a photocurrent signal, and provide the photocurrent signal to a control terminal of the drive circuit;
the compensation circuit is electrically connected to a compensation control terminal, the control terminal of the drive circuit and a first terminal of the drive circuit, and is configured to control a coupling between the control terminal of the drive circuit and the first terminal of the drive circuit under a control of a compensation control signal provided by the compensation control terminal;
the reset circuit is electrically connected to a reset control terminal, a first voltage terminal and the control terminal of the drive circuit, and is configured to control a coupling between the first voltage terminal and the control terminal of the drive circuit under a control of a reset control signal provided by the reset control terminal;
a first terminal of the energy storage circuit is electrically connected to the control terminal of the drive circuit, a second terminal of the energy storage circuit is electrically connected to a second terminal of the drive circuit, and the energy storage circuit is configured to store electric energy; and
the second terminal of the drive circuit is electrically connected to a second voltage terminal, and the drive circuit is configured to generate an amplification photocurrent signal flowing through the second terminal of the drive circuit and the first terminal of the drive circuit under a control of a potential of the control terminal of the drive circuit.

Optionally, the photocurrent amplification circuit described in at least one embodiment of the present disclosure further includes a sampling control circuit,
where the sampling control circuit is electrically connected to a sampling control terminal, the first terminal of the drive circuit and a sampling output terminal, and is configured to control a coupling between the first terminal of the drive circuit and the sample output terminal under a control of a sampling control signal provided by the sampling control terminal, to output the amplification photocurrent signal through the sampling output terminal.

Optionally, the compensation circuit includes a first transistor, and the reset circuit includes a second transistor;
a control electrode of the first transistor is electrically connected to the compensation control terminal, a first electrode of the first transistor is electrically connected to the control terminal of the drive circuit, and a second electrode of the first transistor is electrically connected to the first terminal of the drive circuit; and
a control electrode of the second transistor is electrically connected to the reset control terminal, a first electrode of the second transistor is electrically connected to the first voltage terminal, and a second electrode of the second transistor is electrically connected to the control terminal of the drive circuit.

Optionally, the energy storage circuit includes a storage capacitor, and the drive circuit includes a drive transistor;
a control electrode of the drive transistor is the control terminal of the drive circuit, a first electrode of the drive transistor is the first terminal of the drive circuit, and a second electrode of the drive transistor is the second terminal of the drive circuit; and
a first terminal of the storage capacitor is electrically connected to the control electrode of the drive transistor, and the second terminal of the storage capacitor is electrically connected to the second electrode of the drive transistor.

Optionally, the photoelectric sensor is a photodiode;
an anode electrode of the photodiode is electrically connected to the first voltage terminal, and a cathode electrode of the photodiode is electrically connected to the control terminal of the drive circuit.

Optionally, the sampling control circuit includes a third transistor;
a control electrode of the third transistor is electrically connected to the sampling control terminal, a first electrode of the third transistor is electrically connected to the first terminal of the drive circuit, and a second electrode of the third transistor is electrically connected to the sampling output terminal.

In the second aspect, the embodiment of the present disclosure provides an amplification control method, which is performed by the above-mentioned photocurrent amplification circuit, and the working cycle includes a reset phase, a compensation phase, a discharge phase and a sampling phase set successively; the amplification control method includes:
in the reset phase, writing, by the reset circuit, under a control of the reset control signal, a first voltage signal provided by the first voltage terminal into the control terminal of the drive circuit, to enable the drive circuit to control, under the control of the potential of the control terminal of the drive terminal, the coupling between the first terminal of the drive circuit and the second terminal of the drive circuit when the compensation phase begins;

in the compensation stage, controlling, by the compensation circuit, under the control of the compensation control signal, the coupling between the control terminal of the drive circuit and the first terminal of the drive circuit;

at the beginning of the compensation phase, controlling, by the drive circuit, under the control of the potential of control terminal of the drive circuit, the coupling between the first terminal of the drive circuit and the second terminal of the drive circuit, to charge the energy storage circuit with the second voltage signal provided by the second voltage terminal until the drive circuit disconnects a connection between the first terminal of the drive circuit and the second terminal of the drive circuit, and a potential of the control terminal of the drive circuit is V2−Vth, V2 is a voltage value of the second voltage signal, and Vth is an absolute value of a threshold voltage of the drive transistor included in the drive circuit;

in the discharge stage, sensing, by the photoelectric sensor, the optical signal, converting the optical signal into the photocurrent signal, discharging the energy storage circuit through the photocurrent signal, to charge the potential of the control terminal of the drive circuit;

in the sampling phase, generating, by the drive circuit, under the control of the control terminal of the potential of the control terminal of the drive circuit, the amplification photocurrent signal flowing from the second terminal of the drive circuit to the first terminal of the drive circuit, and outputting the amplification photocurrent signal through the first terminal of the drive circuit.

Optionally, the photoelectric sensor is the photodiode; the anode electrode of the photodiode is electrically connected to the first voltage terminal, and the cathode electrode of the photodiode is electrically connected to the control terminal of the drive circuit; the drive circuit includes the drive transistor;

$VR=V2-Vth-DV-V1$; VR is greater than 0;

where V1 is a voltage value of the first voltage signal, V2 is a voltage value of the second voltage signal, VR is a reverse bias voltage of the photodiode at the end of the discharge phase, and Vth is a threshold voltage of the drive transistor, and DV is a variation of the potential of the control terminal of the drive circuit in the discharge phase.

Optionally, the photocurrent amplification circuit further includes the sampling control circuit; the amplification control method described in at least one embodiment of the present disclosure further includes:

controlling. by the sampling control circuit, under the control of the sampling control signal, the coupling between the first terminal of the drive circuit and the sampling output terminal in the sampling phase, to output the amplification photocurrent signal through the sampling output terminal.

In a third aspect, an embodiment of the present disclosure provides an optical detection module, which includes the above-mentioned photocurrent amplification circuit, a conversion circuit and a detection circuit, where the conversion circuit is electrically connected to the photocurrent amplification circuit, and is configured to convert the amplification photocurrent signal output by the photocurrent amplification circuit into an analog output voltage, and output the analog output voltage through an output terminal of the analog output voltage; and the detection circuit is configured to obtain characteristics of the optical signal sensed by the photoelectric sensor included in the photocurrent amplification circuit according to the analog output voltage.

Optionally, the optical detection module described in at least one embodiment of the present disclosure further includes a filter circuit, where the filter circuit is connected to the output terminal of the analog output voltage and the detection circuit, and is configured to filter a high-frequency noise in the analog output voltage, and provide the analog output voltage of which the high-frequency noise is filtered out, to the detection circuit; and the detection circuit is configured to obtain, according to the analog output voltage of which the high-frequency noise is filtered out, the characteristics of the optical signal.

Optionally, the detection circuit includes an analog-to-digital converter and an output processing unit;

the analog-to-digital converter is configured to convert the analog output voltage into a digital output voltage; the output processing unit is electrically connected to the analog-to-digital converter, and is configured to receive the digital output voltage, and obtaining, according to the digital output voltage, the characteristics of the optical signal.

Optionally, the conversion circuit includes an operational amplifier, a sampling resistor and a feedback capacitor; the photocurrent amplification circuit is configured to output the amplification photocurrent signal through the sampling output terminal;

a non-inverting input terminal of the operational amplifier is electrically connected to a reference voltage terminal, an inverting input terminal of the operational amplifier is electrically connected to the sampling output terminal, and an output terminal of the operational amplifier is the output terminal of the analog output voltage;

a first terminal of the sampling resistor is electrically connected to the inverting input terminal of the operational amplifier, and a second terminal of the sampling resistor is electrically connected to the output terminal of the operational amplifier;

a first terminal of the feedback capacitor is electrically connected to the inverting input terminal of the operational amplifier, and a second terminal of the feedback capacitor is electrically connected to the output terminal of the operational amplifier.

In a fourth aspect, an embodiment of the present disclosure provides a display apparatus, which includes the above-mentioned optical detection module.

Optionally, the photocurrent amplification circuit included in the optical detection module is arranged on a display substrate, both the conversion circuit included in the optical detection module and the detection circuit included in the optical detection module are arranged on a circuit board or a display driving integrated circuit.

DETAILED DESCRIPTION

The technical solutions in the embodiments of the present disclosure will be clearly and completely described with reference to the drawings in the embodiments of the present disclosure below, apparently, the described embodiments are only part of the embodiments of the present disclosure, rather than all embodiments. Based on the embodiments in the present disclosure, all other embodiments obtained by those ordinarily skilled in the art without making creative efforts belong to the protection scope of the present disclosure.

The transistors used in all the embodiments of the present disclosure may be triodes, thin-film transistors or field-effect transistors or other devices with the same characteristics. In the embodiments of the present disclosure, in order to distinguish the two electrodes of the transistor except the control electrode, one electrode is called as the first electrode, and the other electrode is called as the second electrode.

In actual operation, in a case that the transistor is a thin-film transistor or a field-effect transistor, the first electrode may be a drain electrode, and the second electrode may be a source electrode; or, the first electrode may be a source electrode, and the second electrode may be a drain electrode.

Figure 1:
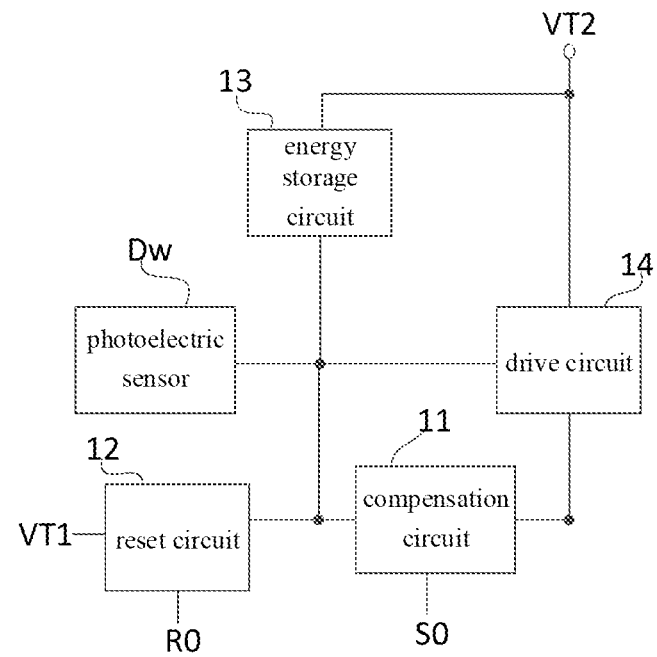
FIG. 1 is a structural view of a photocurrent amplification circuit described in an embodiment of the present disclosure.

As shown in FIG. 1, the photocurrent amplification circuit described in the embodiment of the present disclosure includes a photoelectric sensor Dw, a compensation circuit 11, a reset circuit 12, an energy storage circuit 13 and a drive circuit 14, where the photoelectric sensor Dw is electrically connected to a control terminal of the drive circuit 14, and is configured to sense an optical signal, converting the optical signal into a photocurrent signal, provide the photocurrent signal to the control terminal of the drive circuit 14 and a first terminal of the energy storage circuit 13, and change the potential of the first terminal of the energy storage circuit 13 through the photocurrent signal;

the compensation circuit 11 is electrically connected to a compensation control terminal S0, the control terminal of the drive circuit 14, and the first terminal of the drive circuit 14, respectively, and is configured to control a coupling between the control terminal of the drive circuit 14 and the first terminal of the drive circuit 14 under a control of a compensation control signal provided by the compensation control terminal S0, to make the drive transistors included in the drive circuit 14 to become a diode;

the reset circuit 12 is electrically connected to a reset control terminal R0, a first voltage terminal VT1 and the control terminal of the drive circuit 14 respectively, and is configured to control a coupling between the first voltage terminal VT1 and the control terminal of the drive circuit 14 under a control of a reset control signal provided by the reset control terminal R0;

a first terminal of the energy storage circuit 13 is electrically connected to the control terminal of the drive circuit 14, a second terminal of the energy storage circuit 13 is electrically connected to a second terminal of the drive circuit 14, and the energy storage circuit 13 is configured to store electric energy; and the second terminal of the drive circuit 14 is electrically connected to a second voltage terminal VT2, and the drive circuit 14 is configured to generate an amplification photocurrent signal flowing through the second terminal of the drive circuit 14 and the first terminal of the drive circuit 14 under a control of a potential of the control terminal of the drive circuit 14.

In at least one embodiment of the present disclosure, the photoelectric sensor may be a photodiode, and the photocurrent signal may be a light leakage current signal, but not limited thereto.

In at least one embodiment of the present disclosure, the optical signal may be an ambient optical signal, but not limited thereto; in actual operation, the optical signal may also be an infrared optical signal or optical signal received by the other photoelectric sensor.

In at least one embodiment of the present disclosure, the drive circuit 14 may include a drive transistor, and the drive circuit 14 generates an amplification photocurrent signal under the control of the potential of control terminal thereof, which means that: in a case that the potential of the control terminal of the drive circuit 14 changes to enable the drive transistor included in the drive circuit 14 to be turned on, the drive circuit 14 generates the amplification photocurrent signal.

Optionally, the first voltage terminal VT1 may be used to provide a low voltage, and the second voltage terminal VT2 may be used to provide a high voltage, but not limited thereto.

In at least one embodiment of the present disclosure, the voltage value V1 of the first voltage signal provided by the first voltage terminal VT1 may be around −1V; for example, V1 may be greater than or equal to −2V and less than or equal to 0V;

The voltage value V2 of the second voltage signal provided by the second voltage terminal VT2 may be around 5V, for example, V2 may be greater than or equal to 4V and less than or equal to 6V;

Vth may be around 2V, for example, Vth may be greater than 1.5V and less than 2.5V, where Vth is an absolute value of the threshold voltage of the drive transistor.

The photocurrent amplification circuit described in the embodiments of the present disclosure can amplify the pA-level of photocurrent signal obtained after converting by the photoelectric sensor to nA level or uA level for sampling and detection of an external circuit. The photocurrent amplification circuit described in the embodiments of the present disclosure can improve the signal-to-noise ratio of the current signal on the detection channel by amplifying the photocurrent signal.

Figure 9:
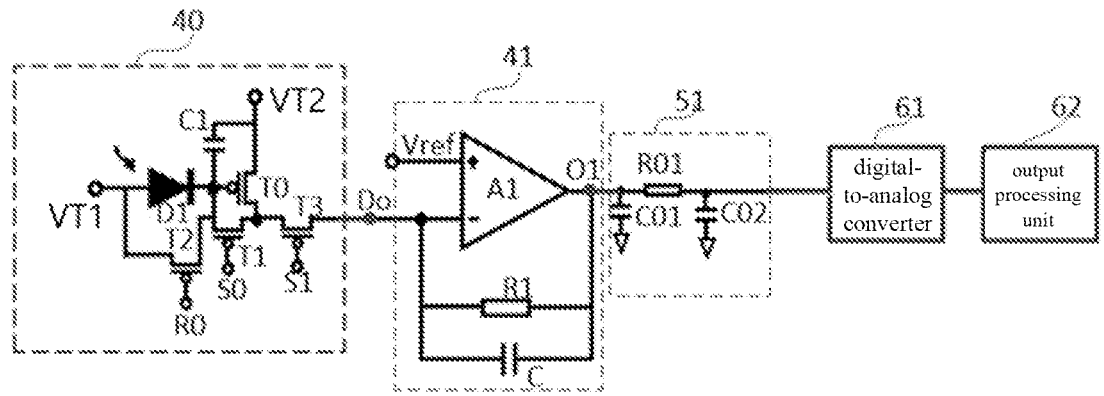
FIG. 9 is a circuit view of the optical detection module according to at least one embodiment of the present disclosure.

In at least one embodiment of the present disclosure, the external circuit may include a conversion circuit 41, a filter circuit 51, a digital-to-analog converter 61, and an output processing unit 62 in FIG. 9. The detection channel may be a channel for transmitting the amplification photocurrent signal between the photocurrent amplification circuit 40 and the conversion circuit 41. In the embodiment of the present disclosure, the amplification photocurrent signal is transmitted to the conversion circuit 41 through the detection channel, thereby improving the signal-to-noise ratio of the current signal on the detection channel.

FIG. 1 in the present disclosure shows an embodiment of a photocurrent amplification circuit during working, and a working cycle includes a reset phase, a compensation phase, a discharge phase and a sampling phase set successively;

in the reset phase, the reset circuit 12 writes a first voltage signal provided by the first voltage terminal VT1 into the control terminal of the drive circuit 14 under a control of the reset control signal, so that in a case that the compensation phase begins, the drive circuit 14 can control the coupling between the first terminal of the drive circuit 14 and the second terminal of the drive circuit 14 under the control of the potential of the control terminal thereof;

in the compensation stage, the compensation circuit 11 controls the coupling between the control terminal of the drive circuit 14 and the first terminal of the drive circuit 14 under the control of the compensation control signal;

at the beginning of the compensation phase, the drive circuit 14 control the coupling between the first terminal of the drive circuit 14 and the second terminal of the drive circuit 14 under the control of the potential of control terminal thereof, so as to charge the energy storage circuit with the second voltage signal provided by the second voltage terminal VT2 until the drive circuit 14 disconnects a connection between the first terminal of the drive circuit 14 and the second terminal of the drive circuit 14, and a potential of the control terminal of the drive circuit 14 is V2−Vth, V2 is a voltage value of the second voltage signal, and Vth is an absolute value of a threshold voltage of the drive transistor comprised in the drive circuit 14;

In the discharge stage, the photoelectric sensor Dw senses the optical signal, converts the optical signal into the photocurrent signal, performs the discharging for the energy storage circuit 13 through the photocurrent signal, and then changes the potential of the control terminal of the drive circuit 14;

In the sampling phase, the drive circuit 14 generates the amplification photocurrent signal flowing from the second terminal of the drive circuit 14 to the first terminal of the drive circuit 14 under the control of the control terminal of the potential of the control terminal of the drive circuit 14, and outputs the amplification photocurrent signal through the first terminal of the drive circuit 14.

In at least one embodiment of the present disclosure, V1, V2 and Vth need to be set to ensure that the photoelectric sensor Dw can perform photoelectric conversion during the entire discharge phase.

Figure 2:
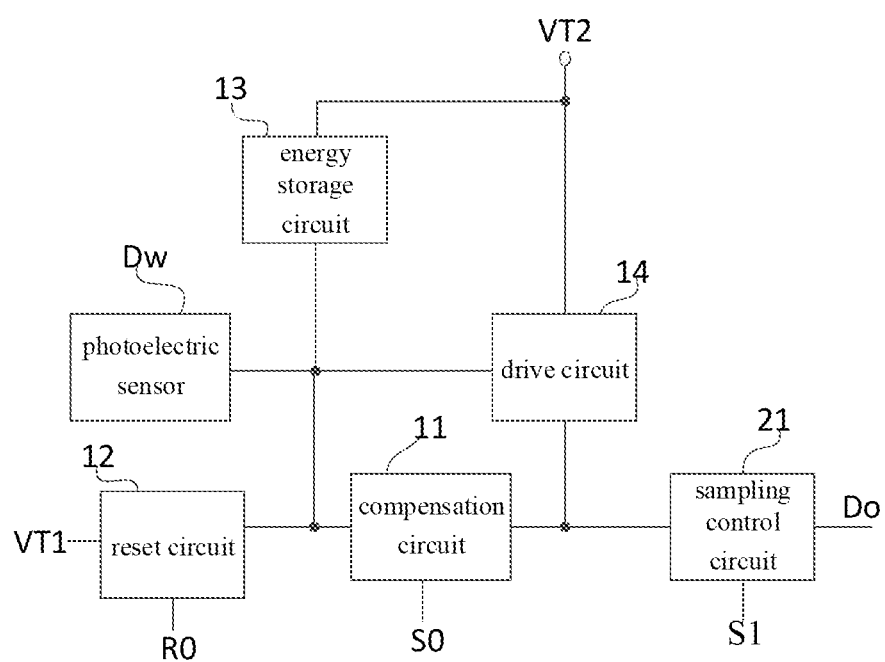
FIG. 2 is a structural view of the photocurrent amplification circuit according to at least one embodiment of the present disclosure.

As shown in FIG. 2, on the basis of the embodiment of the photocurrent amplification circuit shown in FIG. 1, the photocurrent amplification circuit described in at least one embodiment of the present disclosure may further include a sampling control circuit 21;

The sampling control circuit 21 is electrically connected to the sampling control terminal S1, the first terminal of the drive circuit 14, and the sampling output terminal Do respectively, and is configured to control a coupling between the first terminal of the drive circuit 14 and the sampling output terminal Do under a control of a sampling control signal provided by the sampling control terminal S1, so as to output the amplification photocurrent signal through the sampling output terminal Do.

At least one embodiment of the photocurrent amplification circuit shown in FIG. 2 of the present disclosure is implemented. In the sampling phase, the sampling control circuit 21 controls the coupling between the first terminal of the drive circuit 14 and the sampling output terminal Do under the control of the sampling control signal, so as to output the amplification photocurrent signal through the sampling output terminal Do.

Optionally, the compensation circuit includes a first transistor, and the reset circuit includes a second transistor;
  a control electrode of the first transistor is electrically connected to the compensation control terminal, a first electrode of the first transistor is electrically connected to the control terminal of the drive circuit, and a second electrode of the first transistor is electrically connected to the first terminal of the drive circuit; and
  a control electrode of the second transistor is electrically connected to the reset control terminal, a first electrode of the second transistor is electrically connected to the first voltage terminal, and a second electrode of the second transistor is electrically connected to the control terminal of the drive circuit.

Optionally, the energy storage circuit includes a storage capacitor, and the drive circuit includes a drive transistor;
  a control electrode of the drive transistor is the control terminal of the drive circuit, a first electrode of the drive transistor is the first terminal of the drive circuit, and a second electrode of the drive transistor is the second terminal of the drive circuit; and
  a first terminal of the storage capacitor is electrically connected to the control electrode of the drive transistor, and the second terminal of the storage capacitor is electrically connected to the second electrode of the drive transistor.

Optionally, the photoelectric sensor is a photodiode;
  an anode electrode of the photodiode is electrically connected to the first voltage terminal, and a cathode electrode of the photodiode is electrically connected to the control terminal of the drive circuit.

Optionally, the sampling control circuit includes a third transistor;
  a control electrode of the third transistor is electrically connected to the sampling control terminal, a first electrode of the third transistor is electrically connected to the first terminal of the drive circuit, and a second electrode of the third transistor is electrically connected to the sampling output terminal.

Figure 3:
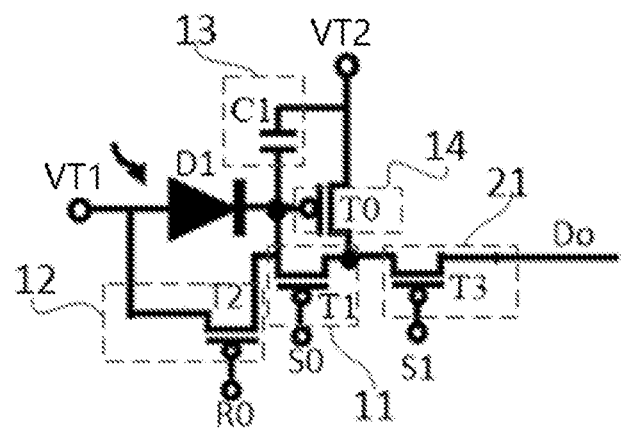
FIG. 3 is a circuit view of the photocurrent amplification circuit according to at least one embodiment of the present disclosure.

As shown in FIG. 3, on the basis of at least one embodiment of the photocurrent amplification circuit shown in FIG.

2, the compensation circuit 11 includes a first transistor T1, and the reset circuit 12 includes a second transistor T2; the drive circuit 14 includes a drive transistor T0;

the gate electrode of the first transistor T1 is electrically connected to the compensation control terminal S0, the drain electrode of the first transistor T1 is electrically connected to the gate electrode of the drive transistor T0, and the source electrode of the first transistor T1 is electrically connected to the drain electrode of the drive transistor T0;

the gate electrode of the second transistor T2 is electrically connected to the reset control terminal R0, the drain electrode of the second transistor T2 is electrically connected to the first voltage terminal VT1, and the source electrode of the second transistor T2 is electrically connected to the gate electrode of the drive transistor T0;

the energy storage circuit 13 includes a storage capacitor C1;

the first terminal of the storage capacitor C1 is electrically connected to the gate electrode of the drive transistor T0, and the second terminal of the storage capacitor C1 is electrically connected to the source electrode of the drive transistor T0;

the source electrode of the drive transistor T0 is electrically connected to the second voltage terminal VT2;

the photoelectric sensor is a photodiode D1;

the anode electrode of the photodiode D1 is electrically connected to the first voltage terminal VT1, and the cathode electrode of the photodiode D1 is electrically connected to the gate electrode of the drive transistor T0;

the sampling control circuit 21 includes a third transistor T3;

the gate electrode of the third transistor T3 is electrically connected to the sampling control terminal S1, the source electrode of the third transistor T3 is electrically connected to the source electrode of the drive transistor T0, and the drain electrode of the third transistor T3 is electrically connected to the sampling output terminal Do.

In at least one embodiment of the photocurrent amplification circuit shown in FIG. 3, the voltage value V1 of the first voltage signal provided by the first voltage terminal VT1 may be −1V, and the voltage value V2 of the second voltage signal provided by the second voltage terminal VT2 may be 5V, and the absolute value Vth of the threshold voltage of the drive transistor T0 may be 2V, but not limited thereto.

In actual operation, the voltage value V1 of the first voltage signal, the voltage value V2 of the second voltage signal, and the absolute value Vth of the threshold voltage of the drive transistor T0 may also be other values, the values of V1, V2, and Vth need to satisfy the condition that VR=V2−Vth−DV−V1, and VR is greater than 0.

In at least one embodiment of the photocurrent amplification circuit shown in FIG. 3, all transistors are p-type thin-film transistors, but not limited thereto.

At least one embodiment of the photocurrent amplification circuit shown in FIG. 3 of the present disclosure is implemented. In order to ensure that the photodiode D1 can always perform photoelectric conversion during the discharge phase, VR needs to be greater than 0, and VR=V2−Vth−DV−V1; where VR is the reverse bias voltage of the photodiode D1 at the end of the discharge phase; DV is the variation of the potential of the gate electrode of the drive transistor T0 during the discharge phase, and DV is greater than 0.

In at least one embodiment of the photocurrent amplification circuit shown in FIG. 3, the photoelectric sensor is a photodiode D1, and the photocurrent signal is a light leakage current signal.

Figure 4:
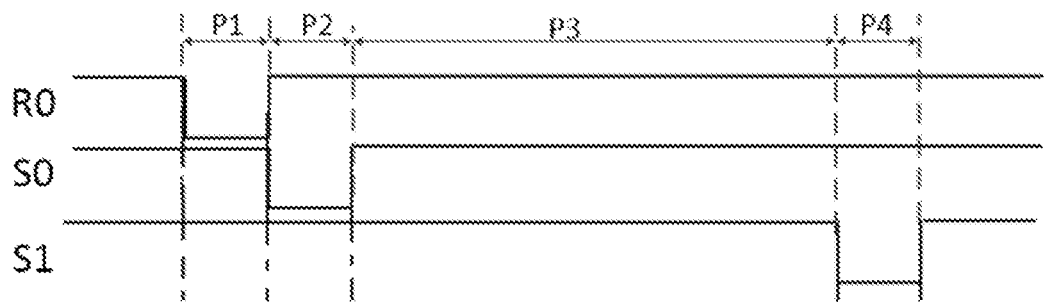
FIG. 4 is a working timing sequence diagram of at least one embodiment of the photocurrent amplification circuit shown in FIG. 3 of the present disclosure.

As shown in FIG. 4, in a case that at least one embodiment of the photocurrent amplification circuit shown in FIG. 3 of the present disclosure is implemented, the working cycle includes a reset phase P1, a compensation phase P2, a discharge phase P3, and a sampling phase P4 set successively;

In the reset phase P1, R0 provides a low-voltage signal, S0 provides a high-voltage signal, S1 provides a high-voltage signal, T2 is turned on, and the first voltage signal is written into the gate electrode of T0 and the first terminal of C1; since V1 is less than V2−Vth−DV, in a case that the compensation phase P2 begins, the gate-source voltage Vgs of the drive transistor T0 is Vgs=V1−V2<−Vth−DV<−Vth, which ensures that the drive transistor T0 can be turned on in a case that the compensation phase P2 begins;

In the compensation phase P2, S0 provides a low-voltage signal, R0 provides a high-voltage signal, S1 provides a high-voltage signal, and T1 is turned on, so that T0 is made to become a diode;

At the beginning of the compensation phase P2, the gate-source voltage Vgs of the drive transistor T0 is less than −Vth, the drive transistor T0 is turned on, and the second voltage terminal VT2 charges the storage capacitor C1 through the drive transistor T0, the gate electrode voltage of the drive transistor T0 starts to rise from V1, in a case that the gate electrode voltage of the drive transistor T0 rises to V2−Vth, the drive transistor T0 is turned off, and at this time the gate electrode voltage of the drive transistor T0 is V2−Vth; in the discharge phase P3, S0 provides a high-voltage signal, R0 provides a high-voltage signal, S1 provides a high-voltage signal, the photodiode D1 is in a reverse bias state, and the photodiode D1 generates a photocurrent signal, so the photocurrent signal flows from the cathode electrode of the photodiode D1 to the anode electrode of the photodiode D1, discharges the storage capacitor C1, and changes the gate electrode voltage of the drive transistor T0;

At the end of the discharge phase P3, the reverse bias voltage VR of the photodiode D1 is equal to V2−Vth−DV−V1, and VR is greater than 0, so as to ensure that in the discharge phase P3, the photodiode D1 can always sense optical signals to generate corresponding photocurrent signals;

In the discharge phase P3, T1 and T2 are turned off, the photodiode D1 senses the optical signal, and converts the optical signal into a photocurrent signal IDR for discharging to C1, and the discharge time is set as T, then the discharge charge ΔQ=IDR×T; the variation of charge on C1 is Qc, Qc=C1z (V2−Vth−V2)−IDR×T=−C1z×Vth−IDR×T; where C1z is the capacitance value of C1; after the storage capacitor C1 is discharged, the voltage Vc at two terminals of the storage capacitor C1 is Vc=(−C1z XVth−IDR)×T/C1z=−Vth−IDR×T/C1z; where Vc is a difference value between the potential of the first terminal of C1 and the potential of the first terminal of C2;

In the sampling phase P4, after discharge, the gate-source voltage Vgs of T0 is Vgs=Vc=−Vth−IDR×T/C1z, the drive current Id of the drive transistor T0 is $$Id = \frac{1}{2}\mu C_{OX}\frac{W}{L}\left(\frac{IDR \times T}{C1z}\right)^2,$$

the drive current Id is the amplification photocurrent signal; where μ is the migration rate of electrons, $C_{OX}$ is the gate oxide layer capacitance per unit area, and is the width-to-length ratio of T0;

In the sampling phase P4, S1 provides a low-voltage signal, both R0 and S0 provide a high-voltage signal, and T3 is turned on to output the amplification photocurrent signal through the sampling output terminal Do.

It can be seen from the above that in the sampling phase P4, the amplification photocurrent signal has nothing to do with Vth, so the photocurrent amplification circuit described in the embodiment of the present disclosure has a threshold voltage compensation function.

The amplification control method described in the embodiment of the present disclosure is applied to the above-mentioned photocurrent amplification circuit, and the working cycle includes a reset phase, a compensation phase, a discharge phase, and a sampling phase set successively; the amplification control method includes:

in the reset phase, writing, by the reset circuit, under a control of the reset control signal, a first voltage signal provided by the first voltage terminal into the control terminal of the drive circuit, so that in a case that the compensation phase begins, the drive circuit can control, under the control of the potential of the control terminal of the drive terminal, the coupling between the first terminal of the drive circuit and the second terminal of the drive circuit;

in the compensation stage, controlling, by the compensation circuit, under the control of the compensation control signal, the coupling between the control terminal of the drive circuit and the first terminal of the drive circuit;

at the beginning of the compensation phase, controlling, by the drive circuit, under the control of the potential of control terminal of the drive circuit, the coupling between the first terminal of the drive circuit and the second terminal of the drive circuit, so as to charge the energy storage circuit with the second voltage signal provided by the second voltage terminal until the drive circuit disconnects a connection between the first terminal of the drive circuit and the second terminal of the drive circuit, and a potential of the control terminal of the drive circuit is V2−Vth. V2 is a voltage value of the second voltage signal, and Vth is an absolute value of a threshold voltage of the drive transistor comprised in the drive circuit;

In the discharge stage, sensing, by the photoelectric sensor, the optical signal, converting the optical signal into the photocurrent signal, performing the discharging for the energy storage circuit through the photocurrent signal, and then changing the potential of the control terminal of the drive circuit;

In the sampling phase, generating, by the drive circuit, under the control of the control terminal of the potential of the control terminal of the drive circuit, the amplification photocurrent signal flowing from the second terminal of the drive circuit to the first terminal of the drive circuit, and outputting the amplification photocurrent signal through the first terminal of the drive circuit.

The photocurrent amplification method described in the embodiments of the present disclosure can amplify the pA-level of photocturent signal obtained after converting by the photoelectric sensor to nA level or uA level for sampling and detection of an external circuit.

Optionally, the photoelectric sensor is the photodiode; the anode electrode of the photodiode is electrically connected to the first voltage terminal, and the cathode electrode of the photodiode is electrically connected to the control terminal of the drive circuit; the drive circuit includes the drive transistor;

VR=V2−Vth−DV−V1; VR is greater than 0, so as to ensure that at the end of the discharge phase, the photodiode is still in a reverse bias state, where V1 is a voltage value of the first voltage signal, V2 is a voltage value of the second voltage signal, VR is a reverse bias voltage of the photodiode at the end of the discharge phase, and Vth is a threshold voltage of the drive transistor, and DV is a variation of the potential of the control terminal of the drive circuit in the discharge phase.

In at least one embodiment of the present disclosure, the photocurrent amplification circuit further includes the sampling control circuit; the amplification control method further includes:

controlling, by the sampling control circuit, under the control of the sampling control signal, the coupling between the first terminal of the drive circuit and the sampling output terminal in the sampling phase, so as to output the amplification photocurrent signal through the sampling output terminal.

Figure 5:
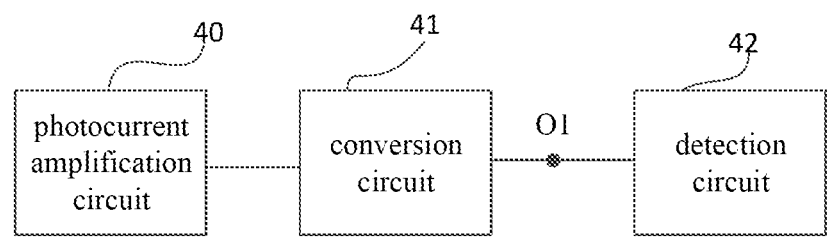
FIG. 5 is a structural view of an optical detection module according to an embodiment of the present disclosure.

As shown in FIG. 5, the optical detection module described in the embodiment of the present disclosure includes the above-mentioned photocurrent amplification circuit 40, conversion circuit 41 and detection circuit 42, where the conversion circuit 41 is electrically connected to the photocurrent amplification circuit 40, and is configured to convert the amplification photocurrent signal output by the photocurrent amplification circuit 40 into an analog output voltage, and output the analog output voltage through an output terminal O1 of the analog output voltage; and the detection circuit 42 is electrically connected to the output terminal O1 of the analog output voltage, and is configured to obtain characteristics of the optical signal sensed by the photoelectric sensor included in the photocurrent amplification circuit 40 according to the analog output voltage.

During specific implementation, the optical detection module may include a photocurrent amplification circuit 40, a conversion circuit 41 and a detection circuit 42, where the conversion circuit 41 converts the amplification photocurrent signal into an analog output voltage, and the detection circuit 42 can obtain the characteristics of corresponding optical signal according to the analog output voltage.

In at least one embodiment of the present disclosure, the characteristics of the optical signal may include light intensity and brightness;

the photoelectric sensor includes a red photodiode, a green photodiode and a blue photodiode (the red photodiode senses a red optical signal, the green photodiode senses a green optical signal, and the blue photodiode senses a blue optical signal), the light characteristics such as the color coordinates and color temperature of the optical signal can be calculated through the characteristics of the red optical signal sensed by the red photodiode, the characteristics of the green optical signal sensed by the green photodiode, and the characteristics of the blue optical signal sensed by the blue photodiode, but not limited to this.

Figure 6:
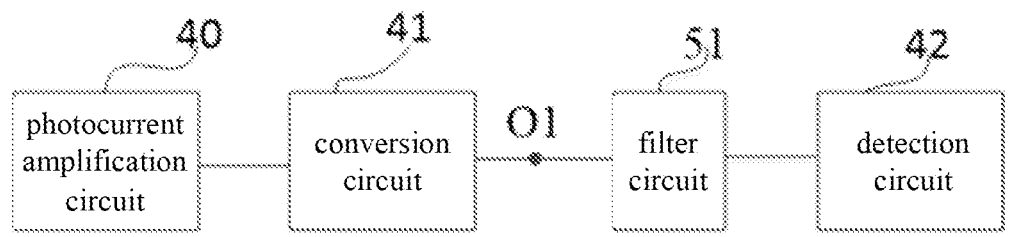
FIG. 6 is a structural view of the optical detection module according to at least one embodiment of the present disclosure.

As shown in FIG. 6, based on the embodiment of the optical detection module shown in FIG. 5, the optical detection module described in at least one embodiment of the present disclosure may further include a filter circuit 51;

the filter circuit 51 is connected to the output terminal O1 of the analog output voltage and the detection circuit 42, and is configured to filter a high-frequency noise in the analog output voltage, and provide the analog output voltage of which the high-frequency noise is filtered out, to the detection circuit 42; and the detection circuit 42 is configured to obtain, according to the analog output voltage of which the high-frequency noise is filtered out, the characteristics of optical signal.

In at least one embodiment of the present disclosure, the detection circuit may include an analog-to-digital converter and an output processing unit;

the analog-to-digital converter is configured to convert the analog output voltage into a digital output voltage;

the output processing unit is electrically connected to the analog-to-digital converter, and is configured to receive the digital output voltage, and obtaining, according to the digital output voltage, the characteristics of the optical signal.

Figure 7:
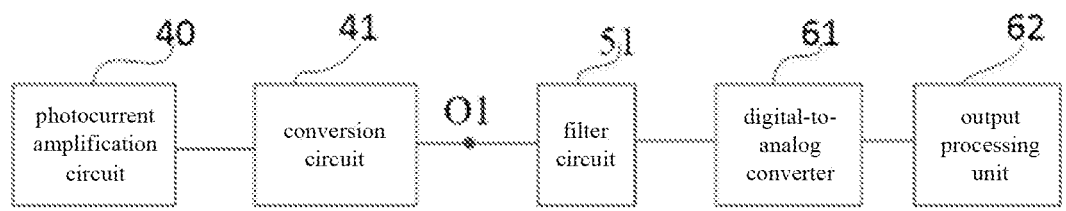
FIG. 7 is a structural view of the optical detection module according to at least one embodiment of the present disclosure.

As shown in FIG. 7, on the basis of at least one embodiment of the optical detection module shown in FIG. 6, the detection circuit may include an analog-to-digital converter 61 and an output processing unit 62;

the analog-to-digital converter 61 is electrically connected to the filter circuit 51, and is configured to convert the analog output voltage of which the high-frequency noise is filtered out, into a digital output voltage;

the output processing unit 62 is electrically connected to the analog-to-digital converter 61, and is configured to receive the digital output voltage and obtaining the characteristics of the optical signal according to the digital output voltage.

In a specific implementation, the output processing unit may be an algorithm unit, which processes the output digital signal, judges the validity of the digital output voltage, and converts the digital output voltage into a digital signal corresponding to light intensity and brightness, and calculates the optical characteristic parameters such as color coordinates or color temperature according to the output digital signals corresponding to different colors, so as to meet the needs of the application unit.

Figure 8:
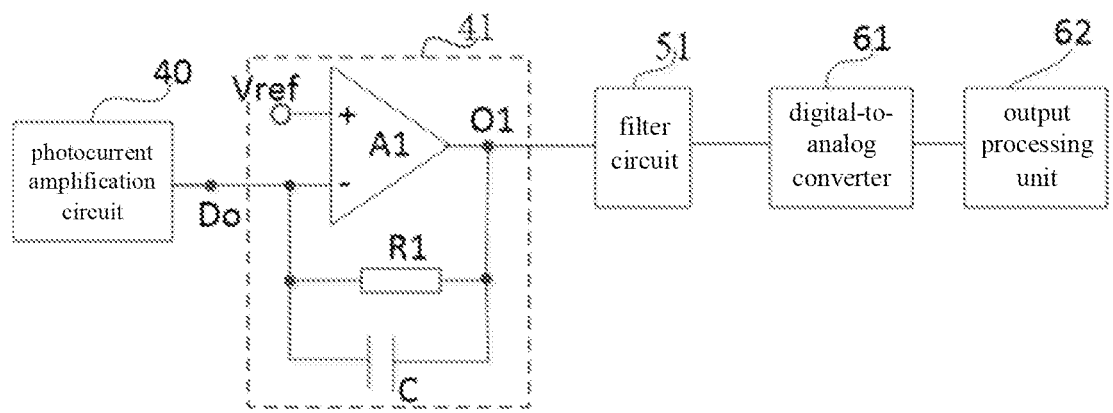
FIG. 8 is a structural view of the optical detection module according to at least one embodiment of the present disclosure.

As shown in FIG. 8, on the basis of at least one embodiment of the optical detection module shown in FIG. 7, the conversion circuit 41 includes an operational amplifier A1, a sampling resistor R1 and a feedback capacitor C; the photocurrent amplification circuit 40 is configured to output the amplification photocurrent signal through the sampling output terminal Do;

a non-inverting input terminal of the operational amplifier A1 is electrically connected to a reference voltage terminal, an inverting input terminal of the operational amplifier A1 is electrically connected to the sampling output terminal Do, and an output terminal of the operational amplifier A1 is the output terminal O1 of the analog output voltage; and the reference voltage terminal is used for providing a reference voltage Vref;

a first terminal of the sampling resistor R1 is electrically connected to the inverting input terminal of the operational amplifier A1, and a second terminal of the sampling resistor R1 is electrically connected to the output terminal of the operational amplifier A1;

a first terminal of the feedback capacitor C is electrically connected to the inverting input terminal of the operational amplifier A1, and a second terminal of the feedback capacitor C is electrically connected to the output terminal of the operational amplifier A1.

At least one embodiment of the optional detection module shown in FIG. 8 of the present disclosure is implemented, the analog output voltage output by O1 is $$Vout = Vref - Id \times R1z = \frac{1}{2}\mu C_{OX} \frac{W}{L} \left(\frac{IDR \times T}{C1z}\right)^2 \times R1z;$$

where R1z is the resistance value of R1; and the voltage of inverting input terminal of A1 is Vref.

As shown in FIG. 9, on the basis of at least one embodiment of the optical detection module shown in FIG. 8, the photocurrent amplification circuit 40 includes a photoelectric sensor, a compensation circuit, a reset circuit, an energy storage circuit and a sampling control circuit; and the photoelectric sensor is a photodiode O1;

the compensation circuit includes a first transistor T1, the reset circuit includes a second transistor T2; and the drive circuit 14 includes a drive transistor T0;

the gate electrode of the first transistor T1 is electrically connected to the compensation control terminal S0, the drain electrode of the first transistor T1 is electrically connected to the gate electrode of the drive transistor T0, and the source electrode of the first transistor T1 is electrically connected to the drain electrode of the drive transistor T0;

The gate electrode of the second transistor T2 is electrically connected to the reset control terminal R0, the drain electrode of the second transistor T2 is electrically connected to the first voltage terminal VT, and the source electrode of the second transistor T2 is electrically connected to the gate electrode of the drive transistor T0; and the first voltage terminal VT1 is used for providing a first voltage signal;

the energy storage circuit includes a storage capacitor C1;

the first terminal of the storage capacitor C1 is electrically connected to the gate electrode of the drive transistor T0, and the second terminal of the storage capacitor C1 is electrically connected to the source electrode of the drive transistor T0;

the source electrode of the drive transistor T0 is electrically connected to the second voltage terminal VT2, and the second voltage terminal VT2 is used for providing a second voltage signal;

the anode electrode of the photodiode D1 is electrically connected to the first voltage terminal VT1, and the cathode electrode of the photodiode D1 is electrically connected to the gate electrode of the drive transistor T0;

the sampling control circuit includes a third transistor T3;

the gate electrode of the third transistor T3 is electrically connected to the sampling control terminal S1, the source electrode of the third transistor T3 is electrically connected to the source electrode of the drive transistor T0, and the drain electrode of the third transistor T3 is electrically connected to the sampling output terminal Do;

the filter circuit 51 includes a filter resistor R01, a first filter capacitor C01 and a second filter capacitor C02;

the first terminal of the filter resistor R01 is electrically connected to the output terminal O1 of the analog output voltage, and the second terminal of the filter resistor R01 is electrically connected to the analog-to-digital converter 61;

the first terminal of the first filter capacitor C01 is electrically connected to the output terminal O1 of the analog output voltage, and the second terminal of the first filter capacitor C01 is grounded;

the first terminal of the second filter capacitor C02 is electrically connected to the second terminal of the filter resistor R01, and the second terminal of the second filter capacitor C02 is grounded.

In at least one embodiment of the photoelectric detection module shown in FIG. 9, the voltage value V1 of the first voltage signal provided by the first voltage terminal VT1 may be −1V, and the voltage value V2 of the second voltage signal provided by the second voltage terminal VT2 may be 5V, and the absolute value Vth of the threshold voltage of the drive transistor T0 may be 2V, but not limited thereto.

In at least one embodiment of the optical detection module shown in FIG. 9, T1, T2, T3 and T0 are thin-film transistors that are all made by LTPS (Low Temperature Poly-silicon, low temperature poly-silicon) PMOS (P-type metal-oxide-semiconductor) process, but only so far.

At least one embodiment of the optical detection module shown in FIG. 9 of the present disclosure is implemented. In the sampling phase, T3 is turned on to output the amplification photocurrent signal to the inverting input terminal of the operational amplifier A1 through the sampling output terminal Do, the operational amplifier A1 converts the amplification photocurrent signal into an analog output voltage Vout; R01, C01 and C02 perform the filtering on the analog output voltage to obtain a filtered analog output voltage, and the analog-to-digital converter 61 performs the analog-to-digital conversion on the filtered analog output voltage to obtain a digital output voltage; and the output processing unit 62 is electrically connected to the analog-to-digital converter 61 for receiving the digital output voltage, and obtaining the characteristics of optical signal according to the digital output voltage.

Figure 10:
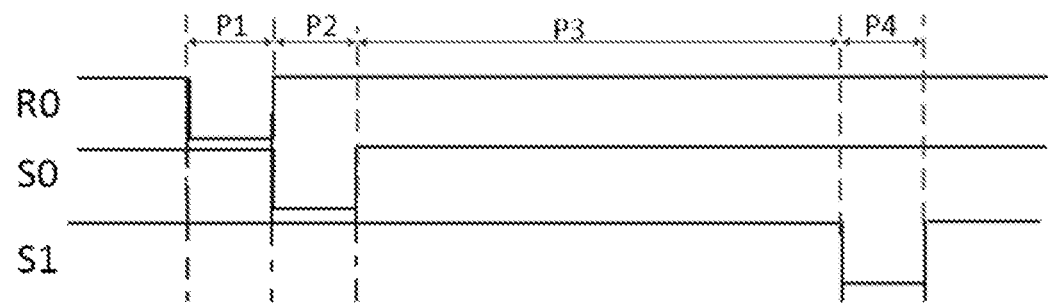
FIG. 10 is a working timing sequence diagram of at least one embodiment of the optical detection module shown in FIG. 9 of the present disclosure.

As shown in FIG. 10, in a case that at least one embodiment of the optical detection module shown in FIG. 9 of the present disclosure is implemented, the working cycle includes a reset phase P1, a compensation phase P2, a discharge phase P3, and a sampling phase P4 set successively;

In the reset phase P1, R0 provides a low-voltage signal, S0 provides a high-voltage signal, S1 provides a high-voltage signal, T2 is turned on, and the first voltage signal provided by the first voltage terminal VT1 is written into the first terminal of CL so that T0 can be turned on in a case that the compensation phase P2 begins;

In the compensation phase P2, S0 provides a low-voltage signal, R0 provides a high-voltage signal, S1 provides a high-voltage signal, T1 is turned on, when V1 is less than V2−Vth (Vth is the absolute value of the threshold voltage of T0), VT2 charges C1 through T0 and T1, and the gate electrode voltage of T0 starts to rise from V1. In a case that the charging time is long enough, when the gate electrode voltage of T0 rises to V2−Vth, T0 is cut off, so at the end of the compensation phase P2, the gate electrode voltage of T0 is V2−Vth;

In the discharge phase P3, S0 provides a high-voltage signal, R0 provides a high-voltage signal, and S1 provides a high-voltage signal. At the beginning of the discharge phase P3, the anode electrode voltage of D1 is V1, and the cathode electrode voltage of D1 is V2−Vth, and V1 needs to be less than V2−Vth;

In the discharge phase P3, T1 and T2 are closed, the photodiode D1 senses the optical signal, and converts the optical signal into a photocurrent signal IDR for discharging to C1, and the discharge time is set as T, then the discharge charge ΔQ=IDR×T, the variation of charge on C1 is Qc, Qc=C1z (V2−Vth−V2)−IDR×T=−C1z×Vth−IDR×T; where C1z is the capacitance value of C1; after the storage capacitor C1 is discharged, the voltage Vc at two terminals of the storage capacitor C1 is Vc=(−C1z×Vth−IDR)×T/C1z=−Vth−IDR×T/C1z; where Vc is a difference value between the potential of the first terminal of C1 and the potential of the first terminal of C2;

In the sampling phase P4, after discharge, the gate-source voltage Vgs of T0 is Vgs=Vc=−Vth−IDR×T/C1z, the drive current Id of the drive transistor T0 is $$Id = \frac{1}{2}\mu C_{OX}\frac{W}{L}\left(\frac{IDR \times T}{C1z}\right)^2,$$

the drive current Id is the amplification photocurrent signal; where μ is the migration rate of electrons, $C_{OX}$ is the gate oxide layer capacitance per unit area, and is the width-to-length ratio of T0;

In the sampling phase P4, in order to ensure that the drive transistor works in a saturation region, it is necessary to set T0 a certain bias voltage Vbias, Vbias=V2−Vref, Vbias is greater than 0, so that the source electrode voltage of T0 is greater than the drain electrode voltage of T0, and the amplification factor is large;

In the sampling phase P4, S1 provides a low-voltage signal, both R0 and S0 provide a high-voltage signal, and T3 is turned on to output the amplification photocurrent signal to the inverting input terminal of the operational amplifier A1 through the sampling output terminal Do, the operational amplifier A1 converts the amplification photocurrent signal into an analog output voltage Vout; R01, C01 and C02 perform the filtering on the analog output voltage to obtain a filtered analog output voltage, and the analog-to-digital converter 61 performs the analog-to-digital conversion on the filtered analog output voltage to obtain a digital output voltage; and the output processing unit 62 is electrically connected to the analog-to-digital converter 61 for receiving the digital output voltage, and obtaining the characteristics of optical signal according to the digital output voltage.

The display apparatus described in the embodiment of the present disclosure includes the above-mentioned optical detection module.

In at least one embodiment of the present disclosure, the photocurrent amplification circuit included in the optical detection module may be arranged on a display substrate, and both the conversion circuit included in the optical detection module and the detection circuit included in the optical detection module may be arranged on a circuit board or a display driving integrated circuit.

The display apparatus provided by the embodiments of the present disclosure may be any product or component with a display function, such as a mobile phone, a tablet computer, a television, a monitor, a notebook computer, a digital photo frame, a navigator, and the like.

The above descriptions are preferred embodiments of the present disclosure. It should be pointed out that those ordinarily skilled in the art can make some improvements and modifications without departing from the principle of the present disclosure, these improvements and modifications should also be regarded as the protection scope of the present disclosure.

What is claimed is:

1. A photocurrent amplification circuit, comprising a photoelectric sensor, a compensation circuit, a reset circuit, an energy storage circuit and a drive circuit, wherein
the photoelectric sensor is configured to sense an optical signal, convert the optical signal into a photocurrent signal, and provide the photocurrent signal to a control terminal of the drive circuit;
the compensation circuit is electrically connected to a compensation control terminal, the control terminal of the drive circuit and a first terminal of the drive circuit, and is configured to control a coupling between the control terminal of the drive circuit and the first terminal of the drive circuit under a control of a compensation control signal provided by the compensation control terminal;
the reset circuit is electrically connected to a reset control terminal, a first voltage terminal and the control terminal of the drive circuit, and is configured to control a coupling between the first voltage terminal and the control terminal of the drive circuit under a control of a reset control signal provided by the reset control terminal;
a first terminal of the energy storage circuit is electrically connected to the control terminal of the drive circuit, a second terminal of the energy storage circuit is electrically connected to a second terminal of the drive circuit, and the energy storage circuit is configured to store electric energy; and
the second terminal of the drive circuit is electrically connected to a second voltage terminal, and the drive circuit is configured to generate an amplification photocurrent signal flowing through the second terminal of the drive circuit and the first terminal of the drive circuit under a control of a potential of the control terminal of the drive circuit.

2. The photocurrent amplification circuit according to claim 1, further comprising a sampling control circuit,
wherein the sampling control circuit is electrically connected to a sampling control terminal, the first terminal of the drive circuit and a sampling output terminal, and is configured to control a communication between the first terminal of the drive circuit and the sample output terminal under a control of a sampling control signal provided by the sampling control terminal, to output the amplification photocurrent signal through the sampling output terminal.

3. The photocurrent amplification circuit according to claim 1, wherein the compensation circuit comprises a first transistor, and the reset circuit comprises a second transistor;
a control electrode of the first transistor is electrically connected to the compensation control terminal, a first electrode of the first transistor is electrically connected to the control terminal of the drive circuit, and a second electrode of the first transistor is electrically connected to the first terminal of the drive circuit; and
a control electrode of the second transistor is electrically connected to the reset control terminal, a first electrode of the second transistor is electrically connected to the first voltage terminal, and a second electrode of the second transistor is electrically connected to the control terminal of the drive circuit.

4. The photocurrent amplification circuit according to claim 1, wherein the energy storage circuit comprises a storage capacitor, and the drive circuit comprises a drive transistor;
a control electrode of the drive transistor is the control terminal of the drive circuit, a first electrode of the drive transistor is the first terminal of the drive circuit, and a second electrode of the drive transistor is the second terminal of the drive circuit; and
a first terminal of the storage capacitor is electrically connected to the control electrode of the drive transistor, and the second terminal of the storage capacitor is electrically connected to the second electrode of the drive transistor.

5. The photocurrent amplification circuit according to claim 1, wherein the photoelectric sensor is a photodiode;
an anode electrode of the photodiode is electrically connected to the first voltage terminal, and a cathode electrode of the photodiode is electrically connected to the control terminal of the drive circuit.

6. The photocurrent amplification circuit according to claim 2, wherein the sampling control circuit comprises a third transistor;
a control electrode of the third transistor is electrically connected to the sampling control terminal, a first electrode of the third transistor is electrically connected to the first terminal of the drive circuit, and a second electrode of the third transistor is electrically connected to the sampling output terminal.

7. An amplification control method, applied to the photocurrent amplification circuit according to claim 1, wherein a working cycle comprises a reset phase, a compensation phase, a discharge phase and a sampling phase set successively; the amplification control method comprises:
in the reset phase, writing, by the reset circuit, under a control of the reset control signal, a first voltage signal provided by the first voltage terminal into the control terminal of the drive circuit, to enable the drive circuit to control, under the control of the potential of the control terminal of the drive terminal, the communication between the first terminal of the drive circuit and the second terminal of the drive circuit when the compensation phase begins;
in the compensation stage, controlling, by the compensation circuit, under the control of the compensation control signal, the communication between the control terminal of the drive circuit and the first terminal of the drive circuit;
when the compensation phase begins, controlling, by the drive circuit, under the control of the potential of control terminal of the drive circuit, the communication between the first terminal of the drive circuit and the second terminal of the drive circuit, to charge the energy storage circuit with the second voltage signal provided by the second voltage terminal until the drive circuit disconnects a connection between the first terminal of the drive circuit and the second terminal of the drive circuit, and a potential of the control terminal of the drive circuit is V2−Vth, V2 is a voltage value of the second voltage signal, and Vth is an absolute value of a threshold voltage of the drive transistor comprised in the drive circuit;
in the discharge stage, sensing, by the photoelectric sensor, the optical signal, converting the optical signal into the photocurrent signal, discharging the energy storage circuit through the photocurrent signal, to change the potential of the control terminal of the drive circuit;

in the sampling phase, generating, by the drive circuit, under the control of the control terminal of the potential of the control terminal of the drive circuit, the amplification photocurrent signal flowing from the second terminal of the drive circuit to the first terminal of the drive circuit, and outputting the amplification photocurrent signal through the first terminal of the drive circuit.

8. The amplification control method according to claim 7, wherein the photoelectric sensor is the photodiode; the anode electrode of the photodiode is electrically connected to the first voltage terminal, and the cathode electrode of the photodiode is electrically connected to the control terminal of the drive circuit; the drive circuit comprises the drive transistor;

$VR = V2 - Vth - DV - V1$; VR is greater than 0;

wherein V1 is a voltage value of the first voltage signal, V2 is a voltage value of the second voltage signal, VR is a reverse bias voltage of the photodiode at the end of the discharge phase, and Vth is a threshold voltage of the drive transistor, and DV is a variation of the potential of the control terminal of the drive circuit in the discharge phase.

9. The amplification control method according to claim 7, wherein the photocurrent amplification circuit further comprises the sampling control circuit; the amplification control method further comprises:

controlling, by the sampling control circuit, under the control of the sampling control signal, the communication between the first terminal of the drive circuit and the sampling output terminal in the sampling phase, to output the amplification photocurrent signal through the sampling output terminal.

10. An optical detection module, comprising the photocurrent amplification circuit according to claim 1, a conversion circuit and a detection circuit, wherein the conversion circuit is electrically connected to the photocurrent amplification circuit, and is configured to convert the amplification photocurrent signal output by the photocurrent amplification circuit into an analog output voltage, and output the analog output voltage through an output terminal of the analog output voltage; and the detection circuit is configured to obtain characteristics of the optical signal sensed by the photoelectric sensor comprised in the photocurrent amplification circuit according to the analog output voltage.

11. The optical detection module according to claim 10, further comprising a filter circuit;

wherein the filter circuit is connected to the output terminal of the analog output voltage and the detection circuit, and is configured to filter a high-frequency noise in the analog output voltage, and provide the analog output voltage of which the high-frequency noise is filtered out, to the detection circuit; and the detection circuit is configured to obtain, according to the analog output voltage of which the high-frequency noise is filtered out, the characteristics of the optical signal.

12. The optical detection module according to claim 10, wherein the detection circuit comprises an analog-to-digital converter and an output processing unit;

the analog-to-digital converter is configured to convert the analog output voltage into a digital output voltage; the output processing unit is electrically connected to the analog-to-digital converter, and is configured to receive the digital output voltage, and obtain, according to the digital output voltage, the characteristics of the optical signal.

13. The optical detection module according to claim 10, wherein the conversion circuit comprises an operational amplifier, a sampling resistor and a feedback capacitor; the photocurrent amplification circuit is configured to output the amplification photocurrent signal through the sampling output terminal;

a non-inverting input terminal of the operational amplifier is electrically connected to a reference voltage terminal, an inverting input terminal of the operational amplifier is electrically connected to the sampling output terminal, and an output terminal of the operational amplifier is the output terminal of the analog output voltage;

a first terminal of the sampling resistor is electrically connected to the inverting input terminal of the operational amplifier, and a second terminal of the sampling resistor is electrically connected to the output terminal of the operational amplifier;

a first terminal of the feedback capacitor is electrically connected to the inverting input terminal of the operational amplifier, and a second terminal of the feedback capacitor is electrically connected to the output terminal of the operational amplifier.

14. A display apparatus, comprising the optical detection module according to claim 1.

15. The display apparatus according to claim 14, wherein the photocurrent amplification circuit comprised in the optical detection module is arranged on a display substrate, both the conversion circuit and the detection circuit comprised in the optical detection module are arranged on a circuit board or a display driving integrated circuit.

\* \* \* \* \*